(12) United States Patent
Tanaka

(10) Patent No.: US 7,800,080 B2
(45) Date of Patent: Sep. 21, 2010

(54) LASER IRRADIATION APPARATUS AND METHOD OF MANUFACTURING SEMICONDUCTOR DEVICE

(75) Inventor: Koichiro Tanaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 408 days.

(21) Appl. No.: 11/812,529

(22) Filed: Jun. 19, 2007

(65) Prior Publication Data

US 2008/0157008 A1    Jul. 3, 2008

Related U.S. Application Data

(62) Division of application No. 10/671,539, filed on Sep. 29, 2003, now Pat. No. 7,259,082.

(30) Foreign Application Priority Data

Oct. 3, 2002 (JP) .............................. 2002-291545

(51) Int. Cl.
  *G21G 1/12* (2006.01)
(52) U.S. Cl. ............ 250/492.2; 250/492.1; 250/492.22; 438/149; 372/9
(58) Field of Classification Search ............. 250/492.2, 250/492.1, 492.21, 492.22; 372/9; 438/149
  See application file for complete search history.

(56) References Cited

U.S. PATENT DOCUMENTS

| 4,530,600 A | 7/1985 | Lopez |
| 4,599,133 A | 7/1986 | Miyao et al. |
| 5,357,365 A | 10/1994 | Ipposhi et al. |
| 5,591,958 A * | 1/1997 | Nishi et al. ................. 250/205 |
| 5,754,571 A | 5/1998 | Endoh et al. |
| 5,854,803 A | 12/1998 | Yamazaki et al. |
| 5,861,337 A | 1/1999 | Zhang et al. |
| 6,136,632 A | 10/2000 | Higashi |
| 6,210,996 B1 | 4/2001 | Yamazaki et al. |
| 6,411,364 B1 * | 6/2002 | Suzuki ........................ 355/53 |
| 6,455,359 B1 | 9/2002 | Yamazaki et al. |

(Continued)

FOREIGN PATENT DOCUMENTS

JP    62-259437    11/1987

(Continued)

*Primary Examiner*—Jack I Berman
*Assistant Examiner*—Michael Maskell
(74) *Attorney, Agent, or Firm*—Eric J. Robinson; Robinson Intellectual Property Law Office, P.C.

(57) ABSTRACT

The transmissivity of an fθ lens which is used as a means for converging laser light differs in the center and in the edge thereof. As a result, when the fθ lens is used as it is with the purpose of crystallizing by laser irradiation, energy distribution of the laser light which is irradiated on the semiconductor film is not uniform so that the whole surface of the semiconductor film could not be irradiated uniformly. Therefore, the present invention provides a laser irradiation apparatus including a galvanometer mirror and an fθ lens that can offset the change of the energy due to the change of transmissivity of the fθ lens and can scan the laser light while controlling the change of the energy on the object to be irradiated. Moreover, the invention provides a manufacturing method of a semiconductor device including the laser irradiation apparatus described above.

27 Claims, 11 Drawing Sheets

U.S. PATENT DOCUMENTS

| | | | |
|---|---|---|---|
| 6,472,295 | B1 | 10/2002 | Morris et al. |
| 6,563,077 | B2 | 5/2003 | Im |
| 6,593,215 | B2 | 7/2003 | Hiraga et al. |
| 6,628,371 | B1 * | 9/2003 | Ishikawa .................... 355/69 |
| 6,639,177 | B2 | 10/2003 | Ehrmann et al. |
| 6,650,480 | B2 | 11/2003 | Tanaka |
| 6,717,101 | B2 | 4/2004 | Morris et al. |
| 6,753,948 | B2 * | 6/2004 | Taniguchi .................... 355/71 |
| 6,770,546 | B2 | 8/2004 | Yamazaki |
| 6,777,645 | B2 | 8/2004 | Ehrmann et al. |
| 6,809,291 | B1 | 10/2004 | Neil et al. |
| 6,822,977 | B1 | 11/2004 | Stamm et al. |
| 6,849,825 | B2 | 2/2005 | Tanaka |
| 6,916,693 | B2 | 7/2005 | Ohnuma et al. |
| 6,944,195 | B2 | 9/2005 | Yamazaki et al. |
| 6,987,786 | B2 | 1/2006 | Cordingley et al. |
| 7,015,422 | B2 | 3/2006 | Timans |
| 7,109,073 | B2 | 9/2006 | Yamazaki |
| 7,112,517 | B2 | 9/2006 | Tanaka et al. |
| 2004/0043310 | A1 * | 3/2004 | Takeishi et al. ............... 430/22 |
| 2004/0065643 | A1 | 4/2004 | Tanaka |
| 2004/0074881 | A1 | 4/2004 | Oishi |
| 2004/0106237 | A1 * | 6/2004 | Yamazaki ................... 438/149 |
| 2005/0155956 | A1 | 7/2005 | Hamada et al. |
| 2008/0035851 | A1 * | 2/2008 | Takeishi et al. ........ 250/370.08 |

FOREIGN PATENT DOCUMENTS

| | | |
|---|---|---|
| JP | 08-195357 | 7/1996 |
| JP | 10-082965 | 3/1998 |
| JP | 10-313146 | 11/1998 |
| JP | 2001-326363 | 11/2001 |
| WO | WO 97/23806 | 7/1997 |

* cited by examiner

LASER IRRADIATION APPARATUS AND METHOD OF MANUFACTURING SEMICONDUCTOR DEVICE

BACKGROUND OF THE INVENTION

1. Field of the Invention

The present invention relates to a laser irradiation apparatus to crystallize the semiconductor film and the like or to activate them after ion implantation by using laser light. In addition to that, the laser irradiation apparatus according to the present invention includes a laser irradiation apparatus to irradiate the laser light on the semiconductor film which is polycrystalline or near-polycrystalline, and improve (promote) crystallinity of the semiconductor film. Furthermore, the present invention relates to a method of manufacturing a semiconductor device using the crystalline semiconductor film formed by the laser irradiation apparatus above.

2. Description of the Related Art

In recent years, the technology to form TFT on a substrate makes great progress and application development to an active matrix type semiconductor device is advanced. Especially the TFT with the polycrystalline semiconductor film is superior in field-effect mobility to TFT with a conventional amorphous semiconductor film and thereby high-speed operation becomes possible. Therefore, it has been tried that pixel that was controlled by the driver circuit provided outside of the substrate so far is controlled by the driver circuit formed on the same substrate as the pixel.

By the way, a substrate for the semiconductor device represented by the TFT is expected to be a glass substrate rather than a monocrystal silicon substrate in terms of its cost. However, a glass substrate is inferior in heat resistance and easy to change its shape when heated. Therefore, when forming the TFT with a polysilicon semiconductor film on a glass substrate, in order not to change the shape of the glass substrate because of heat, laser annealing is performed to crystallize the semiconductor film.

The characteristic of laser annealing is that the processing time can be drastically shortened when compared with annealing method by radiation heating or conductive heating, and that a semiconductor substrate or a semiconductor film can be heated selectively and locally so that the substrate will be hardly damaged thermally.

It is noted that the laser annealing method described here indicates the technology to recrystallize an amorphous layer or a layer damaged by the impurity doping formed on the semiconductor substrate or the semiconductor film, or the technology to crystallize an amorphous semiconductor film formed on the substrate. Moreover, the technology to planarize or modify the surface of the semiconductor substrate or the semiconductor film is also included.

The lasers used for laser annealing are classified broadly into two types according to its oscillation system. In recent years, it has been known that in crystallization of the semiconductor film, a crystal grain formed in the semiconductor film is larger when using a continuous oscillation laser than when using a pulse oscillation laser. When the crystal grain formed in the semiconductor film is large, the number of the grain boundary included in the TFT channel region formed by using the semiconductor film decreases and thereby the mobility becomes high. As a result, such semiconductor film can be applied to a device with high-performance. For this reason, the continuous oscillation laser is beginning to attract attention.

Moreover, when performing laser annealing on the semiconductor or the semiconductor film, the method to convert a laser beam emitted from the laser by an optical system so as to become an elliptical shaped or a line shaped beam and scan a beam spot (surface to be irradiated by the laser) to a surface to be irradiated is known. This method enables an effective irradiation of the laser light on the substrate so that mass-productivity can be enhanced and is superior in the industrial purpose. Therefore this method is employed preferably. (Reference: patent document 1 for example)

Patent document 1: Japanese Patent Application laid-open Hei. 8-195357

In order to perform laser annealing on the semiconductor film formed on the substrate effectively, the method to convert the shape of the laser light emitted from the continuous oscillation laser into the line shape or the elliptical shape by an optical system, and scan the converted beam to the substrate is employed.

In addition, a galvanometer mirror is used as a means to scan the laser light. That is, the laser light which is incident into the galvanometer mirror is deflected to the direction of the substrate and by oscillating the galvanometer mirror to control the incident angle and reflecting angle of the laser light to the galvanometer mirror, the deflected laser beam can be scanned to the whole surface of the substrate. With the structure that the laser light can be scanned only by oscillating the galvanometer mirror, it is not necessary any more to move the substrate back and forth by a stage and the like, and thereby it becomes possible to perform laser irradiation in a short period of time.

It becomes possible to focus the beam deflected by the galvanometer mirror constantly on the plane surface by converging with an fθ lens. The beam deflected by the galvanometer mirror is scanned from the edge to the center of the lens and thereby the beam is scanned on the substrate arranged on the plane surface, that is, the semiconductor film.

However, the transmissivity of the fθ lens used as a means converging laser light is different in the center and the edge thereof. Therefore, when the fθ lens is used as it is for crystallization by a laser, energy distribution of the laser light irradiated on the semiconductor film is not uniform and thereby the laser light cannot be irradiated uniformly on the whole semiconductor film. When irradiating the laser light on the semiconductor film, however, the semiconductor film needed to be processed uniformly by irradiating the laser light uniformly.

Therefore, an object of the present invention is to provide the laser irradiation apparatus of continuous oscillation that can perform a laser irradiation effectively and uniformly. That is to say, the present invention provides the means to offset the difference in the energy distribution due to the difference of the transmissivity of the above lens and homogenize the irradiation energy of the laser light on the surface to be irradiated.

SUMMARY OF THE INVENTION

In view of the problem mentioned above, the present invention is characterized in that the difference in the energy distribution of the laser light on the object to be irradiated is corrected by the scanning speed of the laser light.

It is noted that the laser irradiation apparatus according to the present invention has a laser oscillator (a first means) and an optical system (a second means) to convert the laser light emitted from the laser oscillator. The laser light converted by the optical system is irradiated on the object to be irradiated by a third means to deflect the beam to the direction of the substrate. Moreover, the apparatus according to the present invention has a fourth means to converge the laser light on the substrate. In the structure of the present invention there is a fifth means to control the operating speed of the third means with the purpose to offset the difference in the energy of the beam due to the fourth means.

It is noted that the deflection is made by giving the laser beam a phase changing that has straight line grade in the cross section of the laser beam. For example, when the plane mirror is rotated by θ to the incident light, the reflection light is deflected by 2θ. A rotatory reflection-type light deflector and a rotatory polygonal mirror are manufactured by applying this, and a galvanometer mirror and a polygon mirror are given as its examples.

In other words, the laser irradiation apparatus according to the present invention which includes a galvanometer mirror and an fθ lens can scan the laser light while offsetting the change of the energy due to the transmissivity change of the fθ lens and suppressing the fluctuation of the energy on the object to be irradiated. It is noted that a polygon mirror may be used instead of the galvanometer mirror.

In addition, the object to be irradiated is the semiconductor film formed on the substrate for example, but the semiconductor film is vanishingly thin when compared with the substrate. Therefore, the object to be irradiated is explained as the substrate.

In the above structure, the beam is scanned by the galvanometer mirror, but usually due to the difference in the transmissivity of the lens, the energy is highest in the vicinity of the center of the substrate, and the energy becomes attenuated toward the edge of the substrate. And the transmissivity of the lens differs continuously depending on the place in the lens so that the energy of the transmitted beam also differs continuously. Therefore, the energy of the laser light irradiated on the surface to be irradiated of the substrate increases or decreases according to the scanning speed of the laser light. For this reason the present invention is characterized in that the operating speed of the galvanometer mirror (the speed to oscillate the galvanometer mirror) is changed continuously in accordance with the transmissivity of the place in the lens where the laser light is incident.

As for the concrete operating speed of the galvanometer mirror, in the place in the lens where transmissivity is high, the scanning speed is set to be high. On the other hand, in the place in the lens where transmissivity is low, the scanning speed is set to be low. As a result, the energy irradiated on the substrate can be controlled. That is, the energy fluctuation of the laser light irradiated on the substrate can be prevented by controlling the scanning speed of the beam so as to offset the change of the transmissivity in the lens.

With the laser irradiation apparatus of the present invention above, the laser light can be irradiated to the substrate at high speed. In addition, the whole surface of the substrate can be crystallized uniformly.

It is noted that according to the present invention, even the difference of the energy distribution not due to the optical system like the fθ lens or the galvanometer mirror can be corrected by the scanning speed of the laser light. For example, even in the case that the substrate cannot be arranged evenly and is warped from the center to the edge of the substrate, the difference in the energy distribution can be corrected by controlling the scanning speed of the laser light.

DETAILED DESCRIPTION OF THE PREFERRED EMBODIMENTS

Embodiment Mode

The structure of the laser irradiation apparatus according to the present invention is explained as follows.

Figure 1:
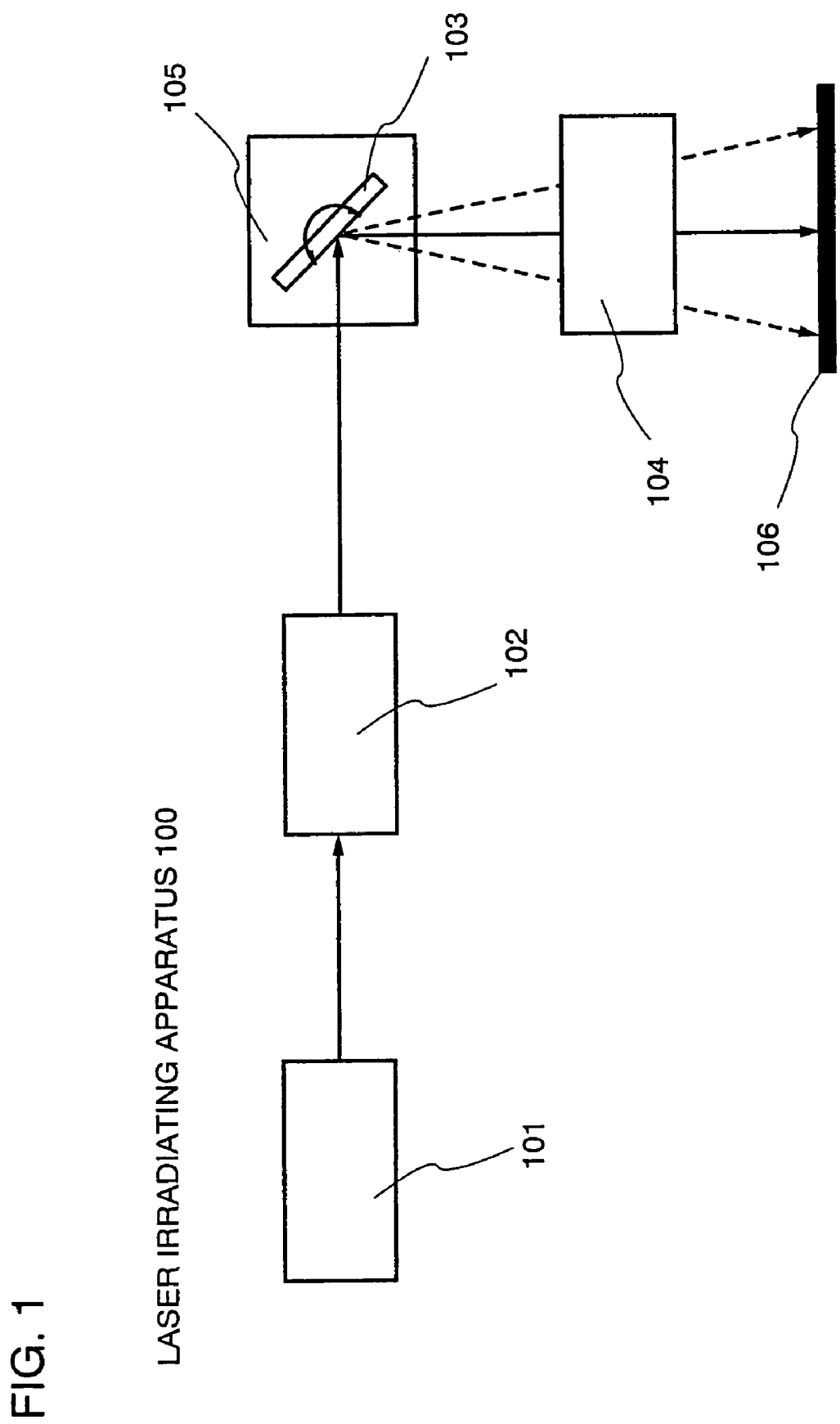
FIG. 1 is a drawing to show the structure of the laser irradiation apparatus according to the present invention.

FIG. 1 shows the outline of the laser irradiation apparatus of the present invention. The laser irradiation apparatus 100 according to the present invention includes the laser oscillator 101 corresponding to the first means to oscillate the laser light. It is noted that FIG. 1 indicates an example providing one laser oscillator 101, however the number of the laser oscillator 101 in the laser irradiation apparatus 100 of the present invention is not limited to one. When a plurality of laser oscillators is used, the beam spots can be unified by overlapping each beam spot of the laser light emitted from each laser oscillator.

The laser can be changed appropriately depending on the purpose of the process. In the present invention, the known laser can be used. The continuous oscillation gas laser or solid laser can be used as the laser oscillator. An Ar laser and a Kr laser and the like are given as the gas laser. A YAG laser, a $YVO_4$ laser, a YLF laser, a $YAlO_3$ laser, a $Y_2O_3$ laser, an Alexandrite laser, and a Ti: Sapphire laser and the like are given as the solid laser. The harmonic with respect to the fundamental can be obtained by using a non-linear optical element.

In addition, after infrared laser light emitted from the solid laser is converted into green laser light by using the non-linear optical element, the green laser light is further converted into ultraviolet laser light by using another non-linear optical element. And this ultraviolet laser light can be used in this embodiment.

Moreover, the laser irradiation apparatus 100 includes an optical element 102 corresponding to the second means that can convert the beam spot on the object to be irradiated of the laser light emitted from the laser oscillator 101.

The shape of the beam spot of the laser light emitted from the laser oscillator 101 on the object to be irradiated 106 is line shape or elliptical shape. It is noted that the shape of the laser light emitted from the laser depends on the kind of the laser. In the case of a YAG laser, when the rod shape is cylindrical, the shape of the laser light becomes circular. On the other hand, when the rod shape is slab type, it becomes rectangular. It is noted that when the laser light is emitted from the slab type laser, its shape is changed significantly depending on the distance from the exit wound of the laser, because the divergence angle of the beam differs vastly in lengthwise and crosswise direction. The laser light like this can be converted into line shaped or elliptical shaped laser light in a desired size by the optical system 102.

Moreover, when plural laser oscillators are used, the beam spots emitted from these laser oscillators may be overlapped each other in order to form one beam spot.

The laser irradiation apparatus 100 of the present invention includes a galvanometer mirror 103 corresponding to the third means to determine the irradiation position of the laser light with respect to the object to be irradiated. By operating the galvanometer mirror 103 so as to change the incident angle and the reflecting angle of the laser light, the irradiation position of the laser light on the object to be irradiated can be moved (scanned), or the scanning direction of the laser light can be changed. The laser light can be scanned on the whole surface of the object to be irradiated by operating the galvanometer mirror 103.

In addition, the laser irradiation apparatus 100 of this invention includes the optical system 104 corresponding to the fourth means. The optical system 104 includes a function to converge the beam spot of the laser light on the object to be irradiated. An fθ lens is used as the optical system 104. The beam spot can be constantly focused on the substrate by using the fθ lens. That the beam spot is constantly focused on the substrate does not always mean that the focal point of the laser light irradiated through the fθ lens is on the substrate, but includes the state that the focal point is displaced on purpose from the substrate. By displacing the focal point from the substrate like this, the surface to be irradiated becomes large, and the processing speed of the laser irradiation is increased. Therefore, the fθ lens includes the function to keep the shape of the laser light constant as desired on the whole surface of the substrate.

In addition, a telecentric fθ lens can be used instead of the fθ lens. By using the telecentric fθ lens, the incident angle with respect to the object to be irradiated after transmitted through the lens is made constant, and the reflectance of the object to be irradiated can be kept constant.

Moreover, the laser irradiation apparatus 100 of the present invention includes the control device 105 corresponding to the fifth means. The control device 105 can operate the galvanometer mirror 103 corresponding to the third means so that the laser light can be irradiated on the whole object to be irradiated. In addition, the difference in the beam energy due to the difference of the transmissivity of the optical system 104 can be offset by changing and controlling its operating speed continuously.

And a semiconductor device in which a variation of electric characteristics is reduced can be obtained by performing laser annealing using the laser irradiation apparatus of the present invention.

Embodiment 1

Figure 2:
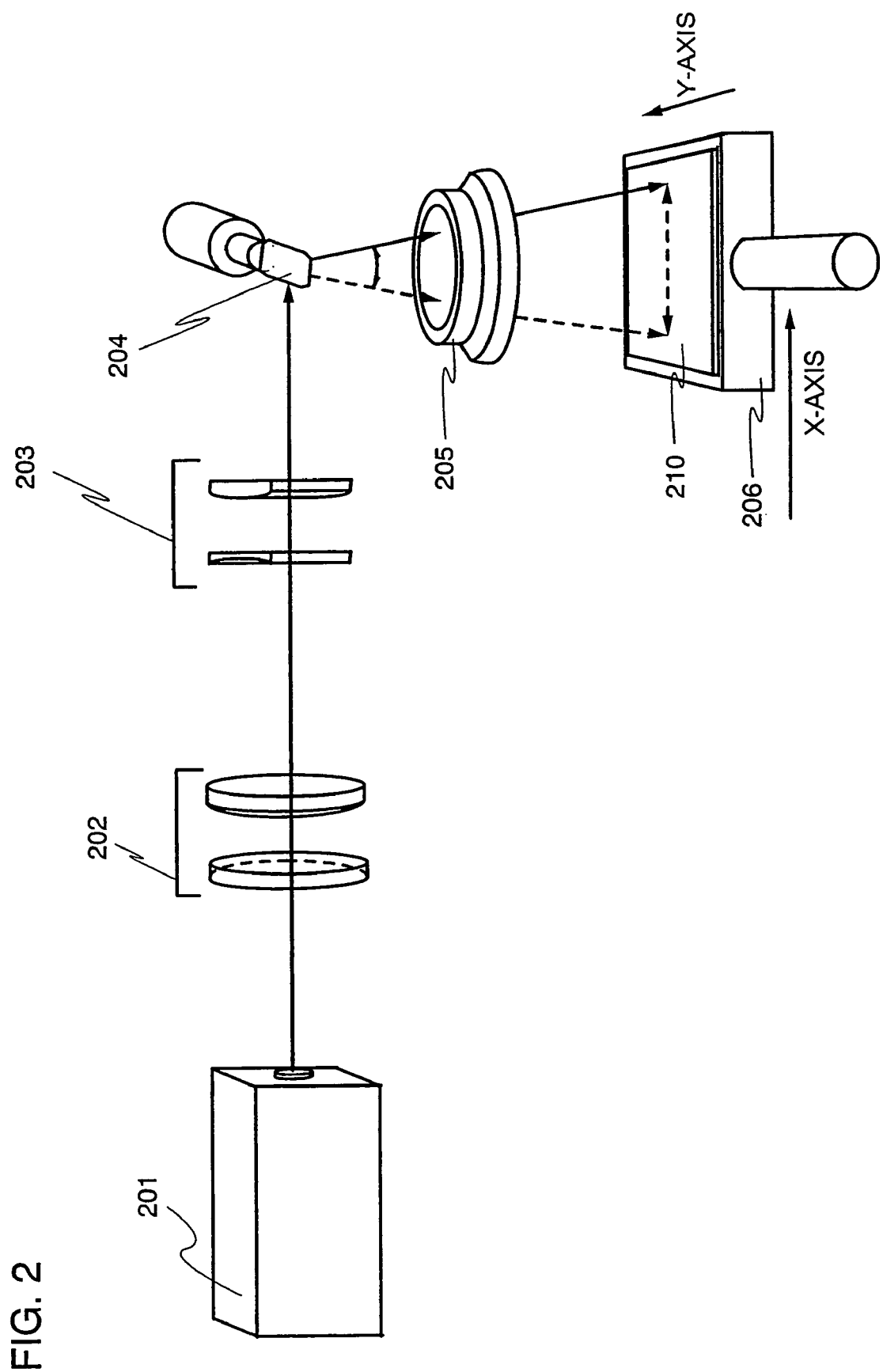
FIG. 2 is a drawing to show an example of the laser irradiation apparatus disclosed by the present invention.

FIG. 2 shows an example of the laser irradiation apparatus according to the present invention. The laser beam emitted from the laser oscillator 201 is converted into a line shaped beam through a beam expander 202 and a cylindrical lens 203. A galvanometer mirror 204 and an fθ lens 205 are arranged over the substrate 210. The beam reflected by the galvanometer mirror 204 is incident into the fθ lens 205. The converted line shaped beam can be constantly focused on the substrate by the fθ lens 205. It is noted that a telecentric lens may be used as the fθ lens 205. The incident angle of the laser light to the substrate can be kept constant by the telecentric lens regardless of the place in the lens where the laser light is incident and thereby the reflectance of the object to be irradiated can be also kept constant. It is noted that in the case that the laser light is irradiated on the substrate like a glass substrate where the laser light is transmitted, an interference fringe may appear because of the reflection from the surface of the substrate and the reflection from the rear surface of the substrate. Therefore, it is also good to take the structure that the laser light is incident obliquely into the substrate.

Figure 3:
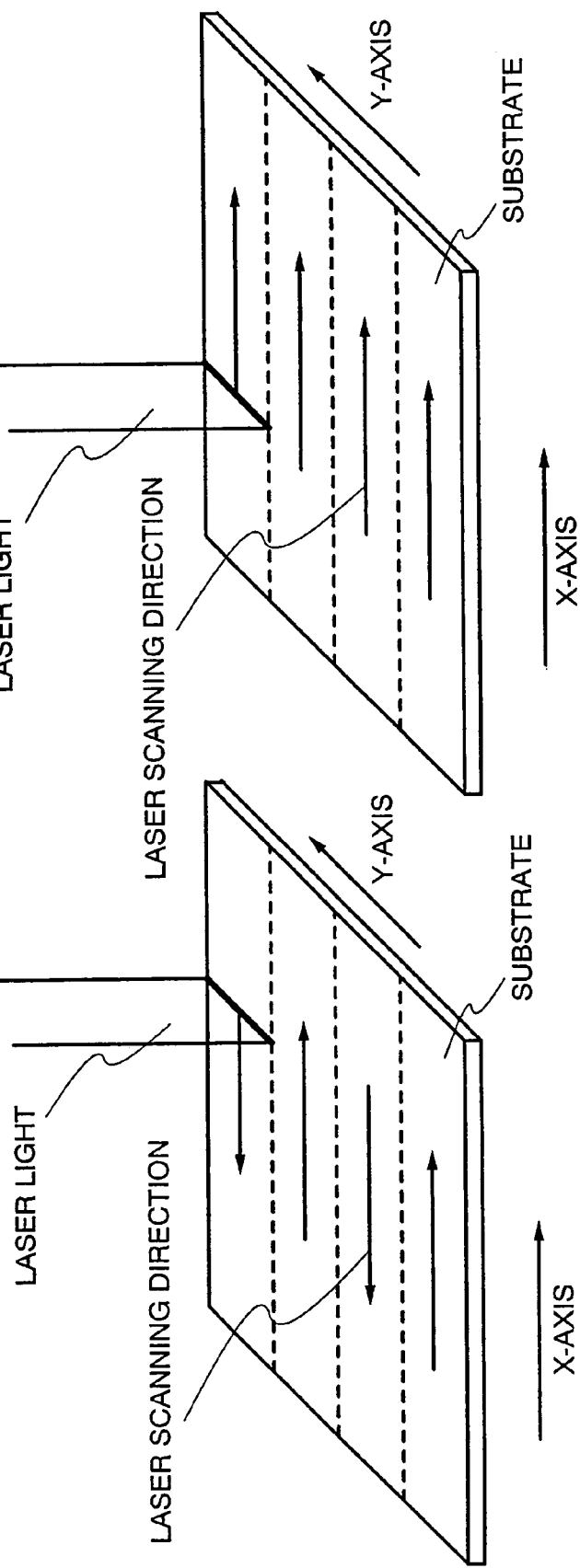
FIGS. 3A and 3B are drawings to show how to scan the laser light.

The laser light is scanned along the X-axis direction in the FIG. 2 by the galvanometer mirror 204. After the scanning along the X-axis direction is done, the substrate is shifted by the width of the beam along the Y-axis direction by the movable stage 206 and the scanning by the galvanometer mirror 204 is performed repeatedly. Thus the laser light can be irradiated on the whole surface of the substrate. As for the scanning of the laser light, the method for scanning the line shaped laser light by moving the X-axis back and forth as shown in FIG. 3A, or the method for scanning in one direction as shown in FIG. 3B may be employed.

Figure 4:
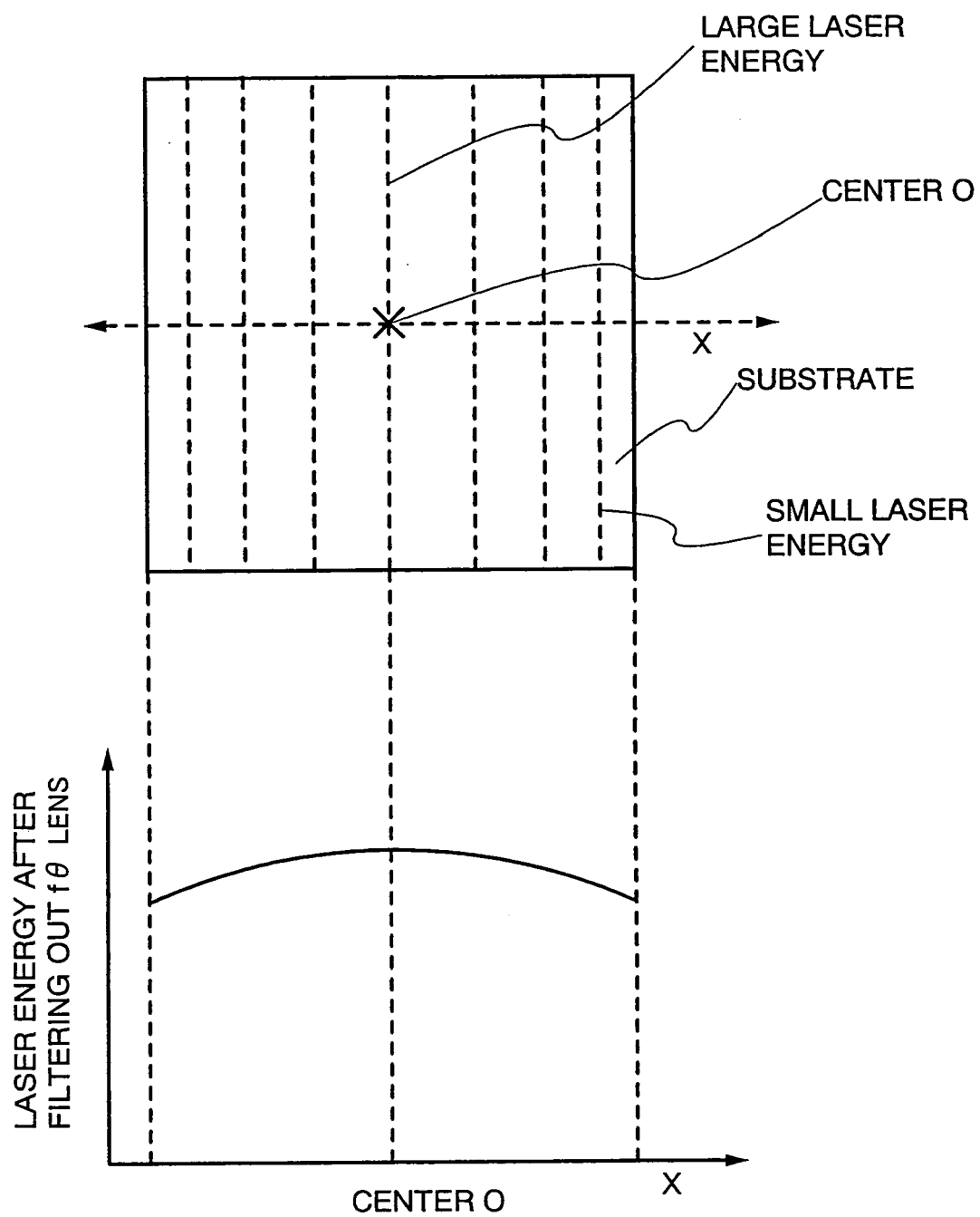
FIG. 4 is a drawing to show the change in the beam energy due to the change of the transmissivity of a lens.
Figure 5:
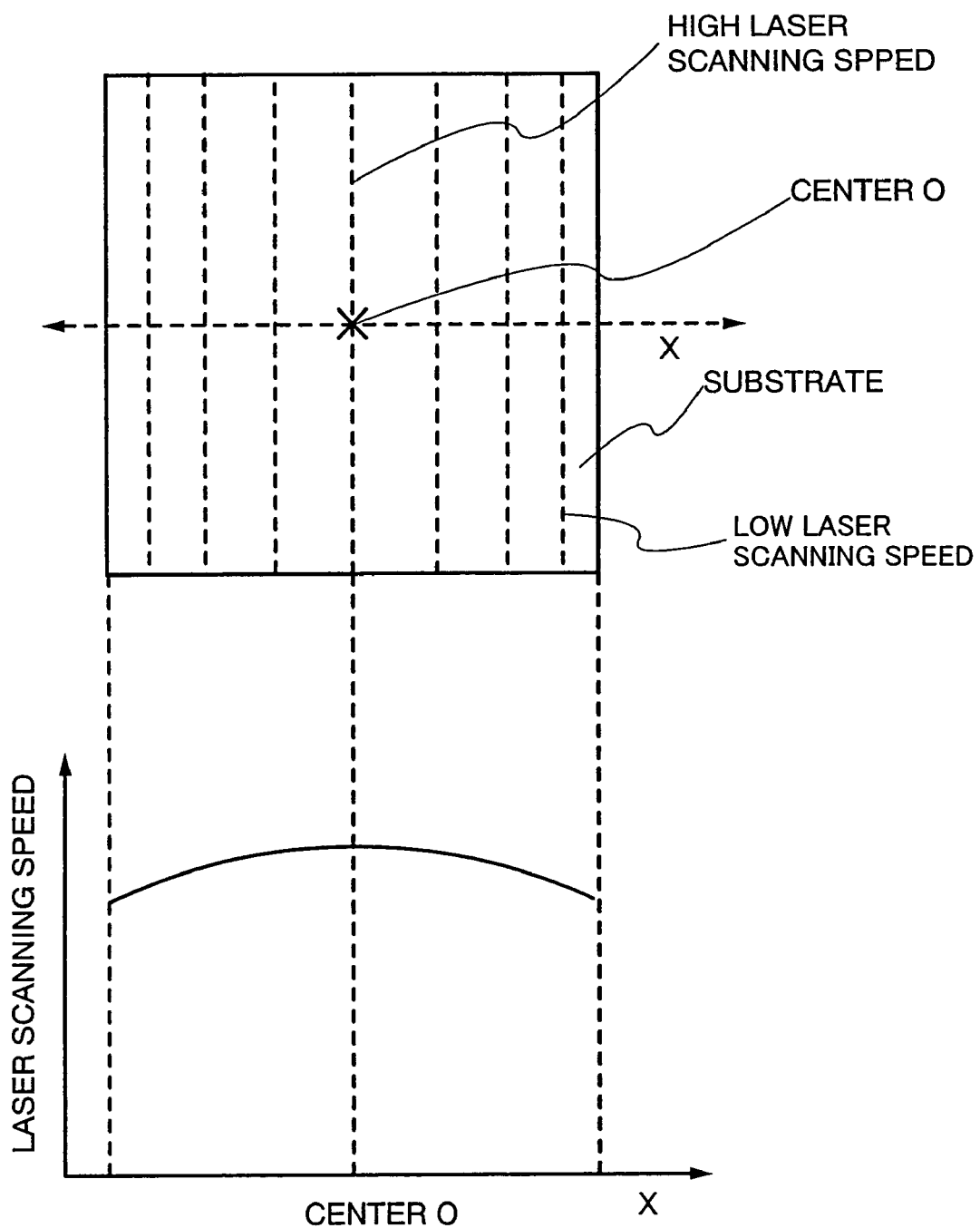
FIG. 5 is a drawing to show an example of the scanning speed of the laser light disclosed in the present invention.

Here, the scanning speed of the laser light by the galvanometer mirror 204 is explained. First, the operating speed of the galvanometer mirror 204 is controlled to keep the scanning speed of the laser light on the substrate constant. In this case, the transmissivity depends on the place in the lens and thereby the energy of the laser light also changes according to the change of the transmissivity. FIG. 4 shows an example of the change in the irradiation energy of the laser light scanned on the substrate. FIG. 4 indicates that the laser intensity is high in the vicinity of the center of the substrate. On the other hand, the laser intensity is low in the vicinity of the edge of the substrate. Therefore, it becomes possible to suppress the change of the irradiation energy on the substrate by increasing the scanning speed of the beam in the vicinity of the center of the substrate where the transmissivity of the lens is high, and decreasing the scanning speed of the beam in the vicinity of the edge of the substrate where its transmissivity is low. In addition, FIG. 5 shows an example of the distribution of the scanning speed of the laser light that can offset the energy change of the beam shown in FIG. 4. With the apparatus of the present invention, the laser light can be scanned with the distribution shown in FIG. 5.

Concretely, the case that the transmissivity of the place in the fθ lens where the laser light is incident when scanned on the center of the substrate differs by 5% from that when scanned on the edge thereof is explained. For example, when a semiconductor film having a thickness of 540 nm is irradiated by the laser light of 532 nm wavelength with the 6.5 W output emitted from a $YVO_4$ laser at the constant scanning speed, there is a gap between the energy irradiated on the center of the substrate and that on the edge of the substrate. Therefore the width of the large-size grain region (the region where the size of the crystal grain is not less than 10 μm) formed in the region of the semiconductor film where the laser light is irradiated (the surface to be irradiated) differs in the center and in the edge of the substrate. Consequently, in order to keep the width of the large-size grain region 180 μm constantly in both the center and the edge of the substrate, the laser light is scanned at the speed of 40 cm/sec in the edge of the substrate, while 42 cm/sec in the center of the substrate. By changing the scanning speed like this, the change in the irradiation energy on the substrate can be suppressed and the width of the large-size grain region is kept constant. It is noted that in the apparatus of the present invention, the scanning speed is not limited to that mentioned above. The scanning speed may be determined depending on the conditions like the width of the large-size grain region, material of the semiconductor film, the thickness of the film and the like as desired.

Moreover, the scanning speed of the laser light is controlled by controlling the operating speed of the galvanometer mirror. By irradiating with the structure above, the change in the irradiation efficiency and the fluctuation in annealing effect on the substrate due to the change of the transmissivity in the lens can be suppressed. It is noted that the pattern for modifying the speed in accordance with the various lens may be stored in advance in the control device of the galvanometer mirror so that the operating speed of the galvanometer mirror may be determined in accordance with the lens shape or its material.

Figure 8:
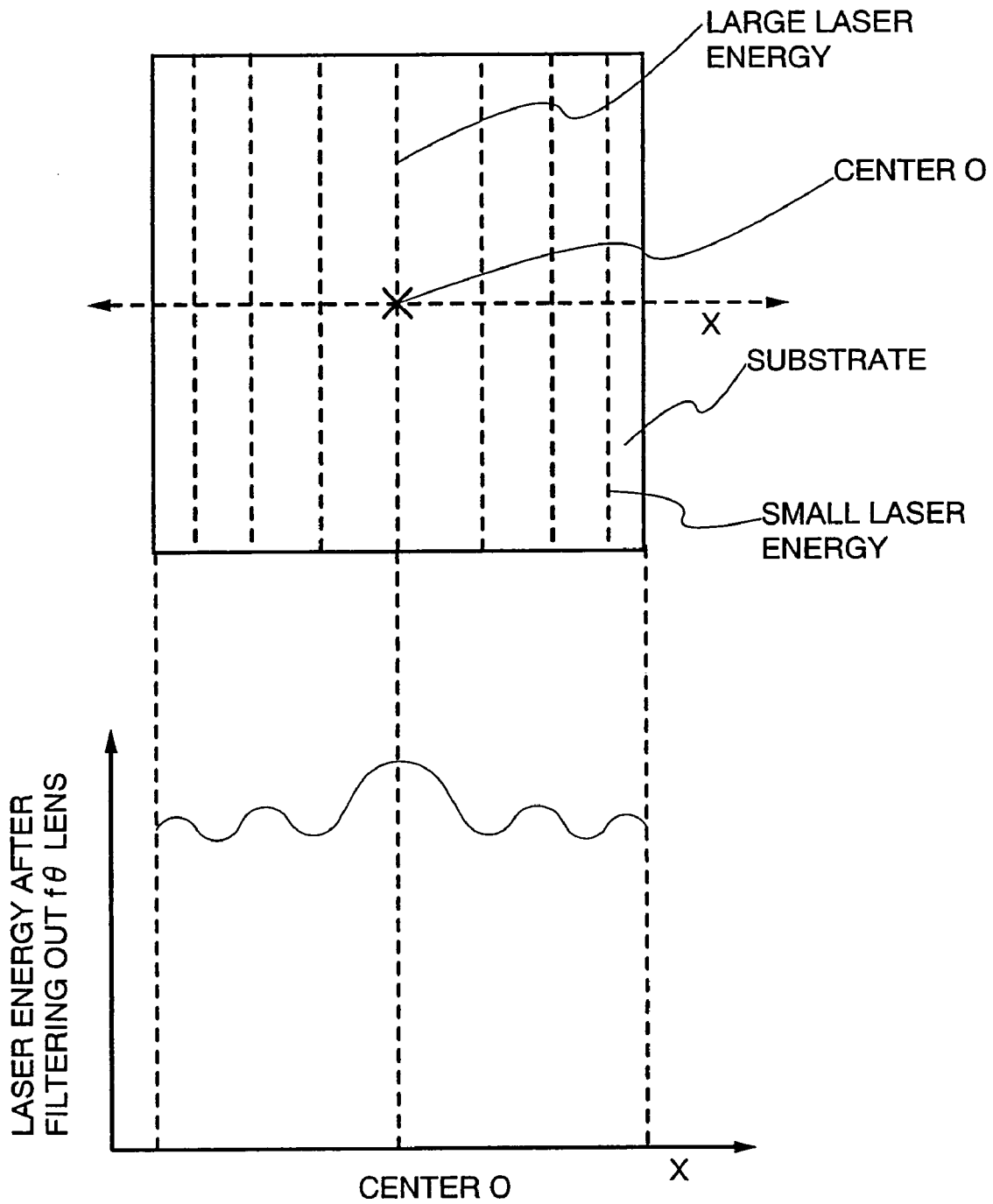
FIG. 8 is a drawing to show the change of the beam energy due to the change of the transmissivity of a lens.

In addition, the change in the irradiation energy of the laser light scanned on the substrate shown in FIG. 4 is just one of the examples. Even in the case that the change in the energy is undulate as shown in FIG. 8, the present invention can be also applied.

Embodiment 2

In this embodiment, the case that the scanning of the laser light in the embodiment 1 is performed by controlling the galvanometer mirror in both X-axis and Y-axis direction is explained.

Figure 6:
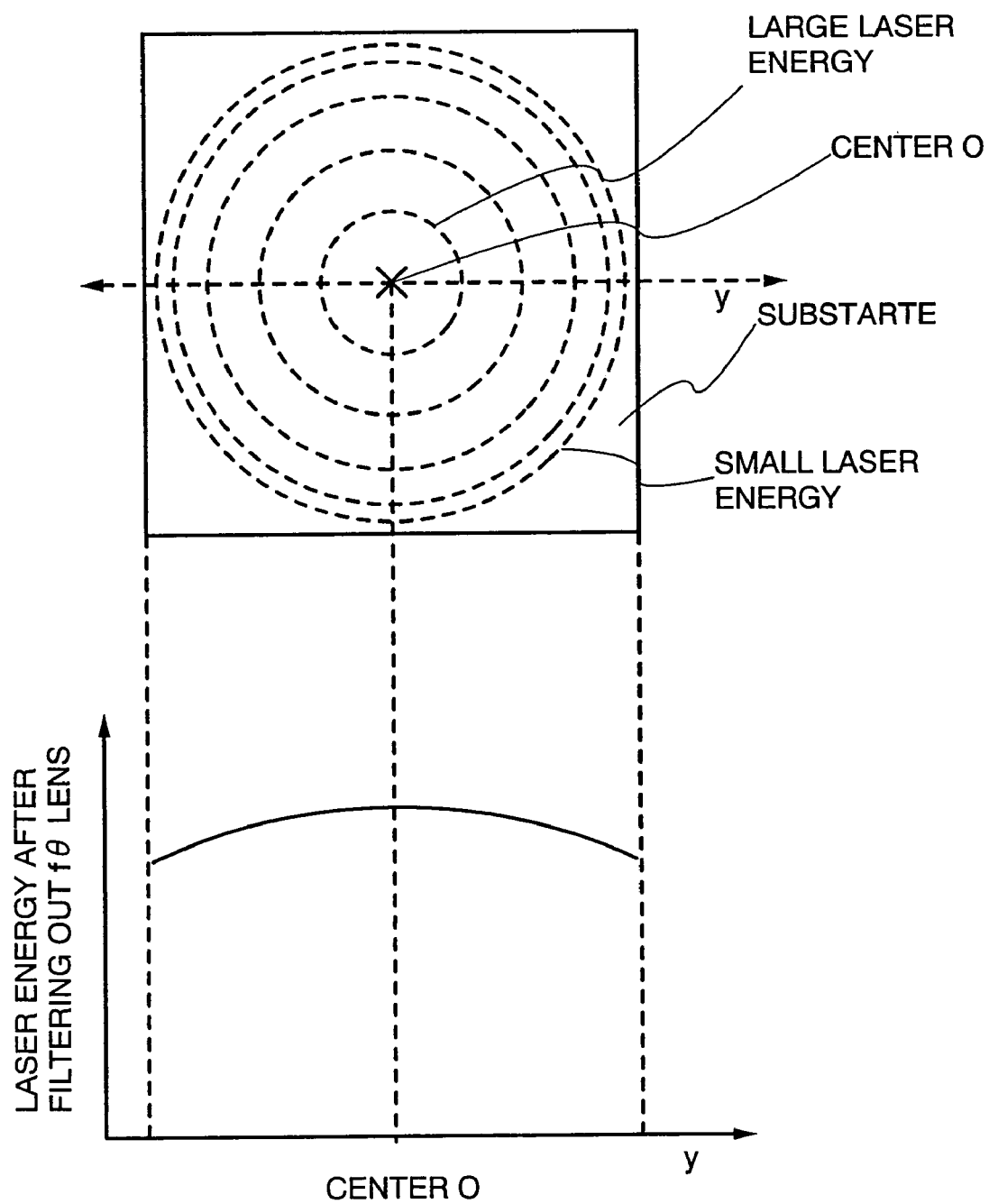
FIG. 6 is a drawing to show the change in the beam energy due to the change of the transmissivity of a lens.

The scanning speed of the laser light by the galvanometer mirror is explained. First, the operating speed of the galvanometer mirror is controlled so as to keep the scanning speed of the laser light on the substrate constant. Since the transmissivity depends on the place in the lens in this case, the energy of the laser light scanned also depends on the change of the transmissivity. FIG. 6 shows an example of the change in the irradiation energy of the laser light scanned on the substrate in this case. FIG. 6 indicates that the laser intensity is high in the vicinity of the center of the substrate and it becomes attenuated toward the edge of the substrate concentrically. Therefore, the change in the irradiation energy on the substrate can be suppressed by increasing the scanning speed in the vicinity of the center of the substrate where the transmissivity is high, and decreasing the scanning speed in the edge of the substrate where the transmissivity is low.

Figure 7:
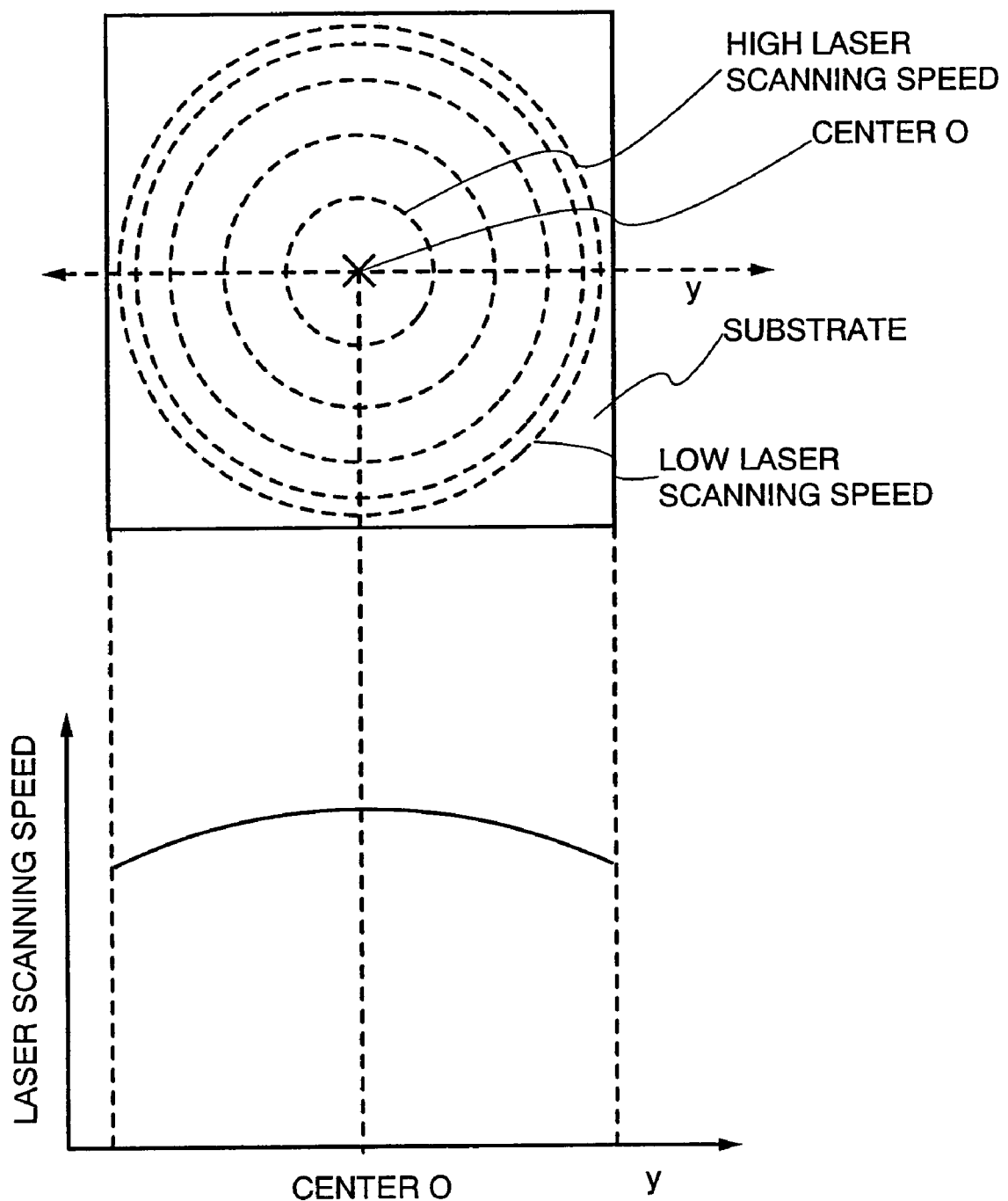
FIG. 7 is a drawing to show the scanning speed of the laser light disclosed in the present invention.

FIG. 7 shows an example of the distribution of the scanning speed of the laser light that can offset the change in the beam energy shown in FIG. 6. In the apparatus of the present invention, the laser light is scanned with the distribution shown in FIG. 7. It is noted that the scanning speed of the laser light is controlled by controlling the operating speed of the galvanometer mirror. By irradiating with the above structure, the change in the irradiation efficiency and the fluctuation in annealing effect on the substrate due to the change of the transmissivity in the lens can be suppressed. It is noted that the pattern for modifying the speed in accordance with the various lens may be stored in advance in the control device of the galvanometer mirror so that the operating speed of the galvanometer mirror may be determined in accordance with the lens shape or its material. In addition, it is preferable that the fluctuation in the beam energy irradiated on the substrate is within ±5% in order to irradiate the substrate uniformly.

The fluctuation in the irradiation energy of the laser light scanned on the substrate shown in FIG. 6 is just one of the examples. Even in the case that the fluctuation in the energy is undulate as shown in FIG. 8, the present invention can be also applied.

As mentioned above, according to the present invention, when crystallizing the semiconductor film on the substrate, the change in the irradiation energy on the substrate can be suppressed to keep the width of the large-size grain region formed in the region where the laser light is irradiated constant by changing the scanning speed. It is noted that the scanning speed may be controlled in accordance with the conditions and the like such as the width of the large-size grain, the material of the semiconductor film, and the thickness of the film as desired.

Embodiment 3

In this embodiment, a process up to manufacture a semiconductor device with the crystalline semiconductor film by using the laser irradiation apparatus of the present invention is described with FIG. 10 and FIG. 11.

First of all, base films 1001a and 1001b are formed on the substrate 1000. As the substrate 1000, an insulating substrate such as a glass substrate, a quartz substrate, or a crystalline glass substrate, or a ceramic substrate, a stainless substrate, a metal substrate (tantalum, tungsten, molybdenum, and the like), a semiconductor substrate, a plastic substrate (polyimide, acrylic, polyethylene terephthalate, polycarbonate, polyarylate, polyether sulfon and the like) can be used. It is noted that the substrate shall be made from the material that can resist the heat generated through the processes. A glass substrate is used in this embodiment.

As the base films 1001a and 1001b, a silicon oxide film, a silicon nitride film or a silicon oxynitride film can be used and these insulating films may be formed in a single-layer structure or laminated-layer structure of two or more layers. These films are formed by the known method such as a sputtering method, a low-pressure CVD method, or a plasma CVD method. The films are laminated as a laminated-layer structure of two layers in this embodiment but a single-layer structure or a laminated-layer structure of three or more layers does not lead to any problems. In this embodiment, the silicon nitride oxide film is formed 50 nm in thickness as a first layer of the insulating film 1001a, and the silicon oxynitride film is formed 100 nm in thickness as a second layer of the insulating film 1001b. It is noted that the difference between the silicon nitride oxide film and the silicon oxynitride film is defined that the ratio of nitrogen and oxygen contained in those films is different, and the silicon nitride oxide film contains more nitrogen than oxygen.

Figure 10A:
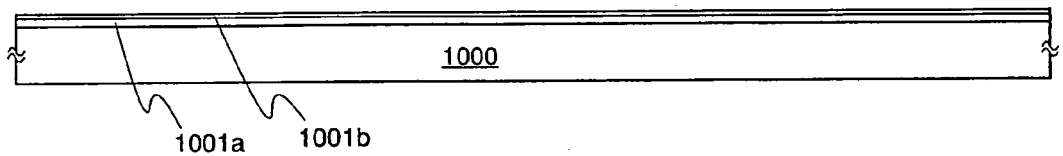
FIGS. 10A to 10D are drawings to show a method of manufacturing a semiconductor device disclosed in the present invention.

Next, an amorphous semiconductor film is formed. The amorphous semiconductor film may consist of silicon or the silicon based material ($Si_xGe_{1-x}$ and the like, for example) from 25 nm to 80 nm in thickness. As for its forming means, the known method such as the sputtering method, the low-pressure method, or the plasma CVD method can be employed. In this embodiment, the amorphous silicon film is formed 66 nm in thickness (FIG. 10A).

Figure 10B:
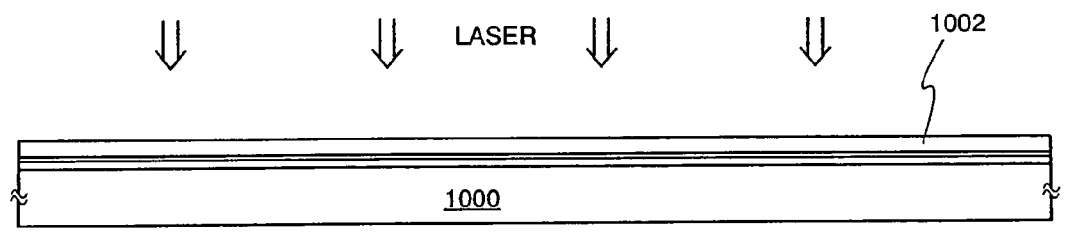

Then the crystallization of the amorphous silicon is performed. In this embodiment, a process to perform laser annealing is explained as the method for crystallization (FIG. 10B).

The laser irradiation apparatus of the present invention is used to perform the laser annealing. The continuous oscillation gas laser or solid laser can be used as the laser oscillator apparatus. An Ar laser, a Kr laser and the like are exemplified as the gas laser and a YAG laser, a $YVO_4$ laser, a YLF laser, a $YAlO_3$ laser, an Alexandrite laser, a Ti: Sapphire and the like are exemplified as the solid laser. One kind or plural kinds selected from the group consisting of $Cr^{3+}$, $Cr^{4+}$, $Nd^{3+}$, $Er^{3+}$, $Ce^{3+}$, $Co^{2+}$, $Ti^{3+}$, $Yb^{3+}$ and $V^{3+}$ is/are doped as impurity in the crystal which is a laser medium of the solid laser.

The laser annealing is performed to crystallize the amorphous silicon by the laser irradiation apparatus of the present invention. More concretely, the laser annealing is performed by the method as described in the embodiment 1 and 2. In this embodiment, a YVO$_4$ laser (532 nm wavelength) with 10 W output is used and the laser light is converted into elliptical shaped laser light of 20 μm in minor axis and of 750 μm in major axis and the incident angle of the laser light to the surface to be irradiated is set to 30°. The scanning speed of the laser light is changed so as to offset the change in the irradiation energy due to the transmissivity change of the fθ lens. By changing the scanning speed as mentioned above, the change in the irradiation energy on the substrate can be suppressed and the width of the large-size grain region can be kept constant.

In addition, when the semiconductor film after crystallized is used as an active layer of TFT, it is preferable that the scanning direction of the laser light is set to be parallel to the shifting direction of the carrier in the channel forming region.

Figure 9:
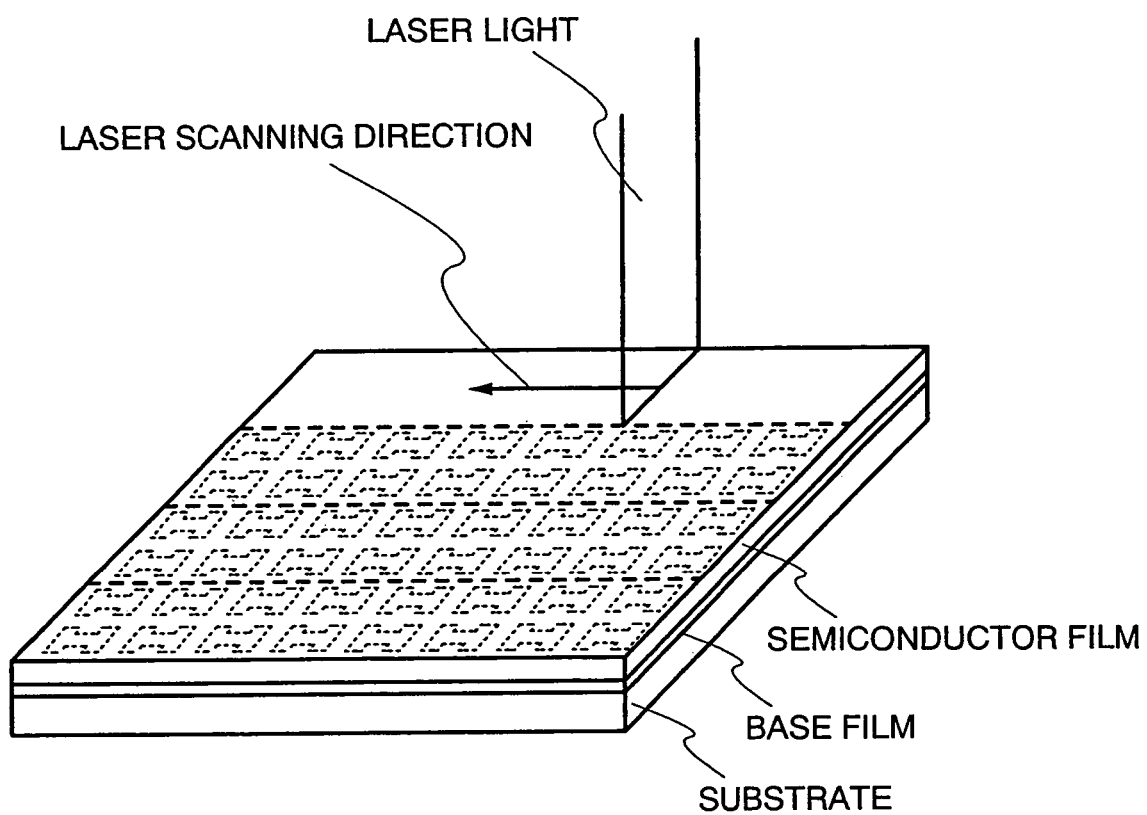
FIG. 9 is a drawing to show how to scan the laser light.

Consequently, the scanning direction of the laser light is determined to be parallel to the shifting direction of the carrier (channel length direction) in the channel forming region as indicated by an arrow shown in FIG. 9. Therefore, the crystal grows along the scanning direction of the laser light and thereby it can be prevented that the grain boundary crosses the channel length direction.

Figure 10C:
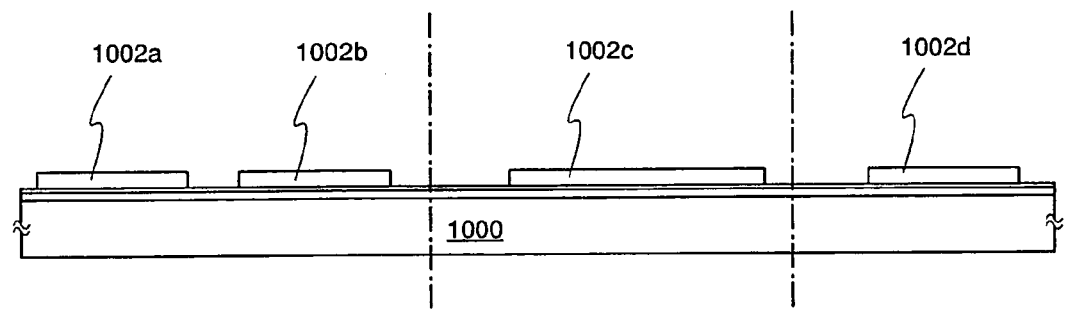
Figure 10D:
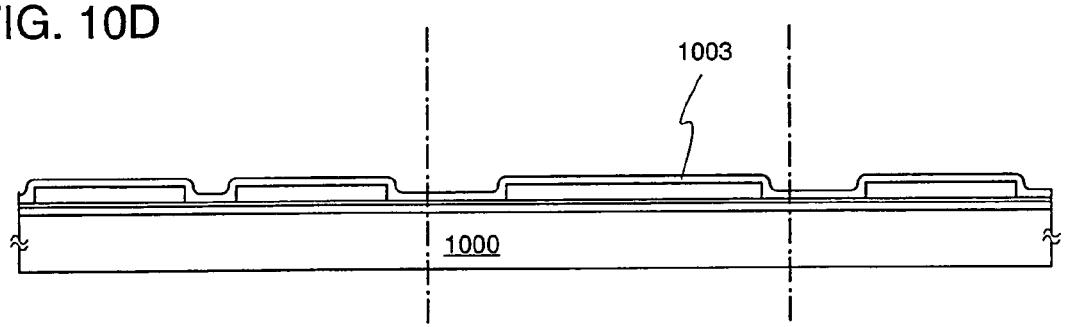

Next, the crystalline semiconductor film is converted into the desired shape 1002*a* through 1002*d* by etching (FIG. 10C). Then a gate insulating film 1003 is formed (FIG. 10D). The film thickness is set to be about 115 nm, and the insulating film including silicon may be formed by the low-pressure CVD method, the plasma CVD method, the sputtering method or the like. In this embodiment, a silicon oxide film is formed. In this case, it is formed by the plasma CVD method with a mixture of TEOS (Tetraethyl Orthosilicate) and O$_2$ at a reaction pressure of 40 Pa, with the substrate temperature set between 300° C. and 400° C., and by discharging at a high frequency (13.56 MHz) electric power density from 0.5 W/cm$^2$ to 0.8 W/cm$^2$. The silicon oxide film which is thus formed gives good characteristics as a gate insulating film by subsequently performing heating process at between 400° C. and 500° C.

By crystallizing the semiconductor film using the laser irradiation apparatus of the present invention, the crystalline semiconductor with good and uniform characteristics can be obtained.

Next, tantalum nitride (TaN) is formed 30 nm in thickness as a first conductive layer on the gate insulating film, and tungsten (W) is formed 370 nm in thickness as a second conductive layer on the first conductive layer. Both the TaN film and the W film may be formed by the sputtering method, and the TaN film is formed by the sputtering using a target of Ta in a nitrogen atmosphere. Further, the W film is formed by sputtering using a target of W. It is necessary to make the film become low resistant in order to use it as a gate electrode, and it is preferable that the resistivity of the W film is made not more than 20 μΩcm. For this reason, it is preferable that the target for the W film is high-purity (99.9999%) and full attention must be paid so that the impurity element is not mixed when the film is formed. The resistivity of the W film thus formed can be made from 9 μΩcm to 20 μΩcm.

It is noted that although in this embodiment the first conductive layer consists of TaN having a thickness of 30 nm, and the second conductive layer consists of W having a thickness of 370 nm, there is no particular limitation for the material of the conductive layers. Both the first conductive layer and the second conductive layer may be formed of the elements selected from the group consisting of Ta, W, Ti, Mo, Al, Cu, Cr, and Nd, or of an alloy material or a chemical compound having one of these elements as its main constituent. Further, a semiconductor film, typically a polycrystalline silicon film in which an impurity element such as phosphorus is doped may be also used, as may an AgPdCu alloy. Moreover, the combination of these can be applied appropriately. The first conductive layer may be formed from 20 nm to 100 nm in thickness. On the other hand, the second conductive layer may be formed from 100 nm to 400 nm in thickness. In addition, a laminated-layer structure of two layers is employed in this embodiment, but a single-layer structure or a laminated-layer structure of three or more layers can be also employed.

Next, a mask made from resist is formed through an exposure process by a photolithography method in order to form electrodes and wirings by etching the conductive layers. The first etching process is performed in accordance with first and second etching conditions. The etching process is performed by using the mask made from resist, and the gate electrodes and the wirings are thus formed. The etching conditions are selected appropriately.

An ICP (Inductively Coupled Plasma) etching method is employed in this embodiment. The etching process is performed under the first etching condition in which a mixed gas of CF$_4$, Cl$_2$ and O$_2$ is used as an etching gas with the gas flow rate 25:25:10 (sccm) respectively, and plasma is generated by applying 500 W RF (13.56 MHz) electric power to a coil shaped electrode at a pressure of 1.0 Pa. 150 W RF (13.56 MHz) electric power is also applied to the substrate side (sample stage), and thereby substantially a negative self-bias voltage is impressed. The W film is etched under the first etching condition, and the edge portions of the first conductive film are made into a tapered shape. In the first etching condition, the etching speed to the W film is 200.39 nm/min. On the other hand, the etching speed to the TaN film is 80.32 nm/min and the selected ratio of the W film to the TaN film is about 2.5. And the angle of the tapered portions in the W film becomes 26° according to the first etching condition.

Next the etching process is performed under the second etching condition without removing the mask made from resist. In the second etching condition, a mixed gas of CF$_4$ and Cl$_2$ is used as an etching gas with the gas flow rate 30:30 (sccm) and plasma is generated by applying 500 W RF (13.56 MHz) to a coil shaped electrode at a pressure of 1.0 Pa. The etching process is performed for about 15 seconds. 20 W RF (13.56 MHz) electric power is also applied to the substrate side (sample stage), and thereby substantially a negative self-bias voltage is impressed. Under the second etching condition using the mixed gas of CF$_4$ and Cl$_2$, the W film and the TaN film are both etched to the same extent.

In the second etching condition, the etching speed to the W film is 58.97 nm/min, while the etching speed to the TaN film is 66.43 nm/min. It is noted that in order to perform the etching process without leaving a residue on the gate insulating film, the time for etching is increased by 10% to 20%. Through the first etching process, the gate insulating film which is not covered by the electrode is etched by about 20 nm to 50 nm.

In the first etching process described above, the end portions of the first and second conductive layers are made into tapered shapes due to the bias voltage impressed to the substrate side.

Figure 11A:
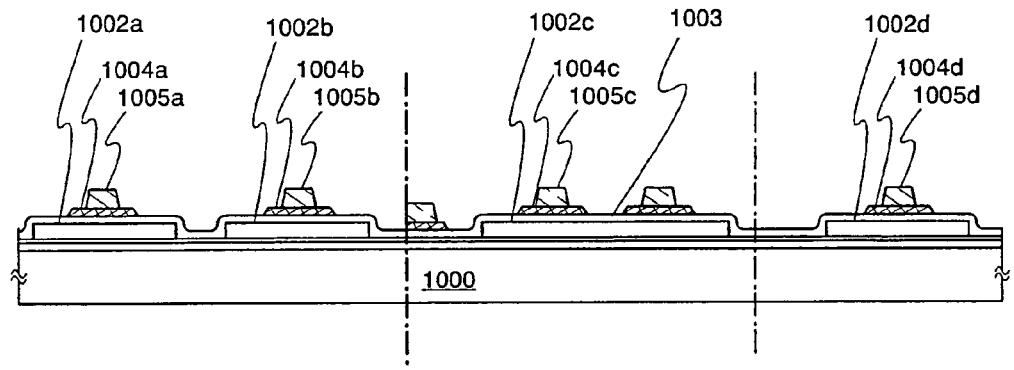
FIGS. 11A and 11D are drawings to show a method of manufacturing a semiconductor device disclosed in the present invention.

Next a second etching process is performed without removing the mask made from resist. The second etching process is performed under the condition in which a mixed gas of SF$_6$, Cl$_2$ and O$_2$ is used as an etching gas with the gas flow rate 24:12:24 (sccm) respectively, and plasma is generated by applying 700 W RF (13.56 MHz) electric power to a coil shaped electrode at a pressure of 1.3 Pa. The etching process is performed for approximately 25 seconds. 10 W RF (13.56 MHz) electric power is also applied to the substrate side (sample stage), and thereby substantially a negative self-bias voltage is impressed. The W film is selectively etched under this etching condition, and the second shaped conductive layer is formed. The first conductive layer is hardly etched in this process. Through the first and second etching processes, the gate electrode consisting of the first conductive layer 1004a to 1004d and the second conductive layer 1005a to 1005d are formed (FIG. 11A).

Then a first doping process is performed without removing the mask made from resist. The impurity element which imparts n-type is doped in the crystalline semiconductor layer at a low concentration through this process. The first doping process may be performed by ion doping method or ion implantation method. Ion doping process is performed under the condition in which the dosage is set from $1\times10^{13}$ atoms/cm$^2$ to $5\times10^{14}$ atoms/cm$^2$, and the acceleration voltage is set from 40 kV to 80 kV. In this embodiment, the acceleration voltage is set to 50 kV. An element belonging to the 15th elements in the periodic table, typically phosphorus (P) or arsenic (As) is used as an impurity element which imparts n-type. Phosphorus (P) is used in this embodiment. Then a first impurity region (N-region) doped low concentrated impurity is formed in a self-aligning manner by using the first conductive layer as the mask.

Next, the mask made from resist is removed. Then the mask made from resist is newly formed, and a second doping process is performed at the higher acceleration voltage than that in the first doping process. The impurity which imparts n-type is doped also through the second doping process. Ion doping is performed under the conditions in which the dosage is set from $1\times10^{13}$ atoms/cm$^2$ to $3\times10^{15}$ atoms/cm$^2$, and the acceleration voltage is set between 60 kV and 120 kV. In this embodiment, the dosage is set to $3\times10^{15}$ atoms/cm$^2$ and the acceleration voltage is set to 65 kV. The second conductive layer is used as a mask against the impurity element through the second doping process and the doping process is performed so that the impurity element is doped also in the semiconductor layer provided below the first conductive layer.

After performing the second doping process, the second impurity region (N$^-$ region, Lov region) is formed on the portion which is not overlapped with the second conductive layer or which is not covered by the mask among the portions which is overlapped with the first conductive layer in the crystalline semiconductor layer. The impurity which imparts n-type is doped to the second impurity region at the concentration in a range of $1\times10^{18}$ atoms/cm$^3$ to $5\times10^{19}$ atoms/cm$^3$. In addition, the impurity which imparts n-type is doped to the portions which are exposed without being covered by both the first shaped conductive layer and the mask (a third impurity region: N$^+$ region) at the high concentration in a range of $1\times10^{19}$ atoms/cm$^3$ to $5\times10^{21}$ atoms/cm$^3$. It is noted that N$^+$ region exists in the semiconductor layer but there is a portion which is covered by only the mask. Since the concentration of the impurity which imparts n-type in this portion stays the same as that when doped in the first doping process, it can be still called the first impurity region (N$^{--}$ region).

The impurity regions are formed by performing the doping process twice in this embodiment, but the number of times for performing it is not limited and depends on the conditions. The conditions are appropriately set so as to form the impurity region at the desired concentration by performing the doping process once or plural times.

Then after removing the mask made from resist, the mask made from resist is newly formed and a third doping process is performed. Through the third doping process, a fourth impurity region (P$^+$ region) and a fifth impurity region (P$^-$ region) which are doped impurity element that imparts the opposite conductivity type of the first and second conductivity type are formed in the semiconductor layer which becomes P-channel type TFTs.

Through the third doping process, the fourth impurity region (P$^+$ region) is formed on the portion which is not covered by the mask made from resist and further is not overlapped with the first conductive layer. And the fifth impurity region (P$^-$ region) is formed on the portion which is not covered by the mask made from resist and which is overlapped with the first conductive layer but not overlapped with the second conductive layer. An element belonging to the 13th elements in the periodic table, typically boric acid (B), aluminum (Al), gallium (Ga) or the like is known as the impurity which imparts p-type.

In this embodiment, the fourth impurity region and the fifth impurity region are formed by the ion doping method using diborane (B$_2$H$_6$) by selecting boric acid (B) as the impurity which imparts p-type. As the conditions of the ion doping method, the dosage is set to $1\times10^{16}$ atoms/cm$^2$ and the acceleration voltage is set to 80 kV.

It is noted that the semiconductor layer to form the N-channel TFT is covered by the mask made from resist through the third doping process.

Through the first and the second doping processes, phosphorus (P) is doped in the fourth impurity region (P$^+$ region) and the fifth impurity region (P$^-$ region) at the different concentration respectively. However, in both the fourth impurity region (P$^+$ region) and the fifth impurity region (P$^-$ region), the third doping process is performed so that the impurity element which imparts p-type is doped at the concentration in a range of $1\times10^{19}$ atoms/cm$^2$ to $5\times10^{21}$ atoms/cm$^2$. Therefore, the fourth impurity region (P$^+$ region) and the fifth impurity region (P$^-$ region) work as the source region or the drain region without any problems.

It is noted that in this embodiment, the fourth impurity region (P$^+$ region) and the fifth impurity region (P$^-$ region) are formed by performing the third doping process once, but the number of times to perform it is not limited to this. The doping process may be performed plural times appropriately depending on its conditions to form the fourth impurity region (P$^+$ region) and the fifth impurity region (P$^-$ region).

Figure 11B:
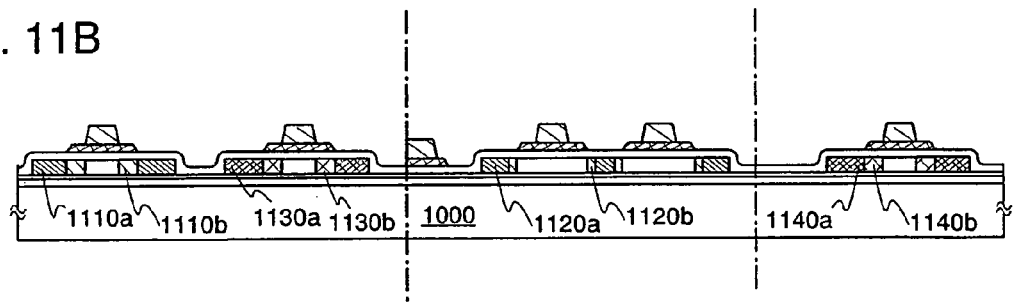

By performing these doping processes, the first impurity region (N$^{--}$ region) 1120b, the second impurity region (N$^-$ region, Lov region) 1110b, the third impurity region (N$^+$ region) 1110a, 1120a, the fourth impurity region (P$^+$ region) 1130a, 1140a, and the fifth impurity region (P$^-$ region) 1130b, 1140b are formed (FIG. 11B).

Next, after removing the mask made from resist, a first passivation film 1200 is formed. The insulating film including silicon is formed from 100 nm to 200 nm in thickness as the first passivation film 1200. The plasma CVD method or the sputtering method can be employed as its forming method. In this embodiment, a silicon oxynitride film is formed 100 nm in thickness by the plasma CVD method. In the case to use the silicon oxynitride film, the silicon oxynitride film consisting of SiH$_4$, N$_2$O and NH$_3$ or the silicon oxynitride film consisting of SiH$_4$ and N$_2$O may be formed by the plasma CVD method. In this case, these films are formed under the conditions at a reaction pressure from 20 Pa to 200 Pa, with the substrate temperature set between 300° C. and 400° C., and by discharging at a high frequency (60 MHz) electric power density from 0.1 W/cm$^2$ to 1.0 W/cm$^2$. In addition, the silicon oxynitride hydride film consisting of SiH$_4$, N$_2$O and H$_2$ may be applied as the first passivation film 1200. Of course, the first passivation film 1200 is not limited to the single-layer structure of the silicon oxynitride film as shown in this embodiment. The insulating film including silicon may be used for a single-layer structure or the laminated-layer structure as the first passivation film 1200.

After that, a heating process is performed to recover the crystallinity of the semiconductor layer and activate the impurity elements doped in the semiconductor layer. The heating process may be performed in the nitrogen atmosphere with the oxygen concentration of not more than 1 ppm, preferably not more than 0.1 ppm, at the temperature between 400° C. and 700° C. In this embodiment, the heating process is performed at the temperature of 410° C. for one hour in order to perform activating process. It is noted that, in addition to the heating process, laser annealing method, or rapid thermal annealing method (RTA method) can be also applied.

Furthermore, by performing the heating process after forming the first passivation film 1200, hydrogenation of the semiconductor film can be performed at the same time of activating process. Hydrogenation is performed in order to terminate the dangling bond of the semiconductor layer by hydrogen included in the first passivation film 1200.

Moreover, the heating process may be performed before forming the first passivation film 1200. However, it is noted that in the case that the materials used in the first conductive layer 1040a to 1040d and the second conductive layer 1050a to 1050d are of low-resistance against heat, it is preferable that the heating process is performed after forming the first passivation film 1200 in order to protect the wirings and the like as shown in this embodiment. Further, in this case, hydrogenation by applying the hydrogen contained in the passivation film 1200 cannot be performed because there is not the first passivation film 1200.

In this case, hydrogenation by applying hydrogen excited by plasma (plasma hydrogenation), or hydrogenation by the heating process in the atmosphere including the hydrogen of 3% to 100% at the temperature between 300° C. and 450° C. for 1 hour to 12 hours may be conducted.

Figure 11C:
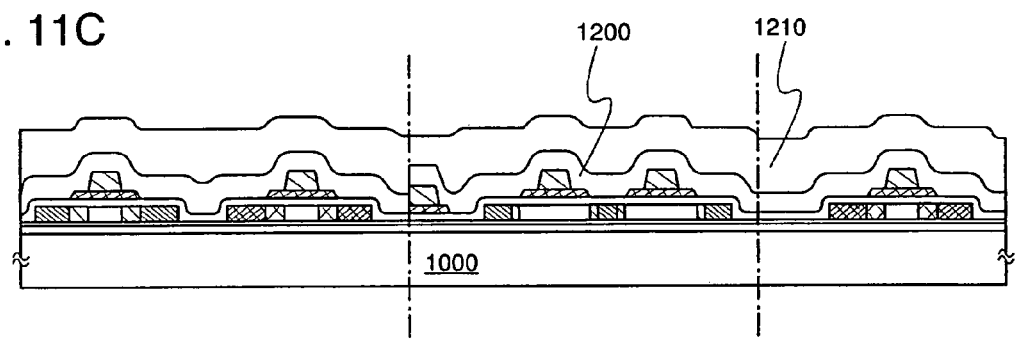
Figure 11D:
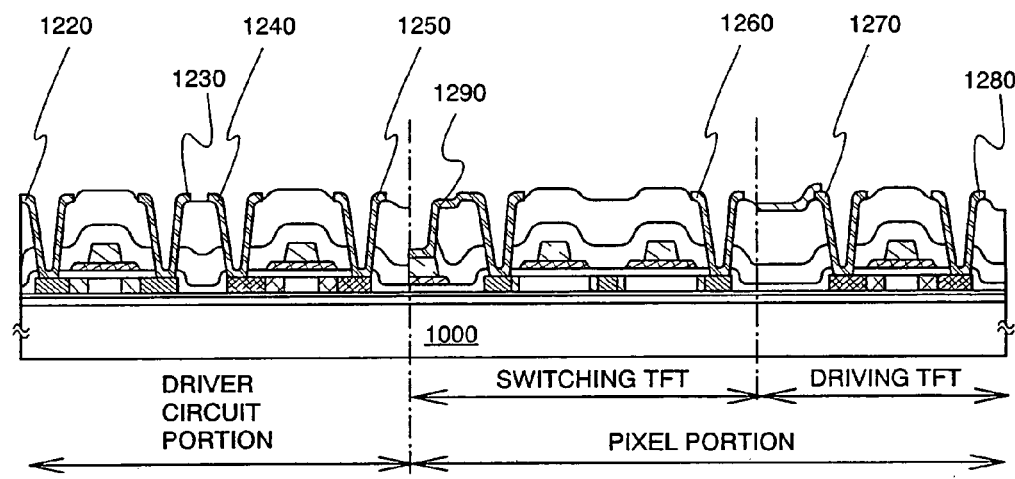

Next, a first interlayer insulating film 1210 is formed on the first passivation film 1200. An inorganic insulating film or an organic insulating film may be used as the first interlayer insulating film 1210 (FIG. 11C). As the inorganic insulating film, the silicon oxide film formed by the CVD method, the silicon oxide film formed by the SOG (Spin On Glass) method or the like may be used. As the organic insulating film, polyimide, polyamide, BCB (benzocyclobutene), acrylic, or positive type photosensitive organic resin, negative type photosensitive organic resin or the like can be used. In addition, the laminated-layer structure of the acrylic film and the silicon oxynitride film may be employed.

Moreover, the interlayer insulating film can be formed of the material including at least hydrogen in the substituent and with the structure in which silicon (Si) and oxygen (O) are bond. Furthermore, the interlayer insulating film can be formed of the material with at least one selecting from the group consisting of fluorine, alkyl group, and aromatic hydrocarbon in the substituent. The representative example is siloxanic polymer.

Siloxanic polymer can be classified into silica-glass, alkyl siloxanic polymer, alkyl silceschioxanic polymer, silceschioxanic polymer hydride, alkyl silceschioxanic polymer hydride and the like by its structure.

In addition, the interlayer insulating film may be formed of the material including the polymer with Si—N bond (polysilazane).

By using the above material, even though the interlayer insulating film is made to be thinner, the interlayer insulating film with sufficient insulating property and evenness can be obtained. Moreover, since the above material shows high-resistance against heat, the interlayer insulating film which can resist through reflowing process in the multilayers wirings. Furthermore, because its hygroscopic property is low, the interlayer insulating film with small dehydration amount can be formed.

In this embodiment, the non-photosensitive acrylic film having a thickness of 1.6 μm is formed. The unevenness by TFT formed on the substrate can be modified and be made even by the first interlayer insulating film. Especially since the first interlayer insulating film is provided mainly for planarization, the insulating film formed of the material which is easily planarized is preferable.

After that, a second passivation film (not shown in the figure) consisting of a silicon nitride oxide film and the like is formed on the first interlayer insulating film from 10 nm to 200 nm in thickness approximately. The second passivation film can suppress the moisture moving in and out of the first interlayer insulating film. The second passivation film may be formed of a silicon nitride film, an aluminum nitride film, an aluminum oxynitride film, a diamond-like carbon (DLC) film, or a carbon nitride (CN) film as well.

In addition, the film formed by the RF sputtering method is extremely precise, and is superior in its barrier property. When forming the silicon oxynitride film for example, the film is formed under the conditions for the RF sputtering where the Si is used as a target, the mixed gas of $N_2$, Ar, and $N_2O$ is set to 31:5:4 at the gas flow rate respectively, the pressure is 0.4 Pa and the electric power is 3000 W. Furthermore, when forming the silicon nitride film, the film is formed under the conditions where the Si is used as a target, the mixed gas of $N_2$ and Ar is set to 20:20 at the gas flow rate respectively, the pressure is 0.8 Pa, the electric power is 3000 W and the temperature in forming film is set to 215° C. In this embodiment, the silicon oxynitride film is formed 70 nm in thickness by the RF sputtering method.

Next, the second passivation film, the first interlayer insulating film and the first passivation film are etched (by performing the etching process) to form a contact hole that reaches the third and the fourth impurity region.

After that, the wirings and the electrodes (1220 to 1290) that connect with each impurity region electrically are formed. It is noted that these wirings are formed by patterning the laminated-layer film consisting of the Ti film having a thickness of 50 nm and the alloy film (Al and Ti) having a thickness of 500 nm. Of course, it is not limited to the laminated-layer structure of two layers, but a single-layer structure or a laminated-layer structure of three or more layers may be applied. Moreover, the material for the wirings is not limited to Al and Ti. For example, the wirings are formed by patterning the laminated-layer film where an Al film or a Cu film is formed on the TaN film, and a Ti film is further formed thereon.

As shown above, when the semiconductor device is manufactured by using the laser irradiation apparatus of the present invention, it shows good and uniform characteristic, and thereby it can be applied to various electrical devices, especially a display device preferably. Moreover, the reliability of such devices can be highly improved.

EFFECT OF THE INVENTION

The laser irradiation apparatus using the galvanometer mirror and the fθ lens can perform the processes to the substrate in a short period of time. The operating speed of the galvanometer mirror is controlled and the scanning speed of the laser light is changed continuously so that the change in transmissivity of the lens is offset. With the structure above, it becomes possible that the laser light is irradiated while controlling the irradiation energy. Therefore, according to the present invention, the change in the energy of the laser light on the substrate can be suppressed. And the semiconductor device in which the variation in electric characteristics is decreased can be obtained by applying the laser irradiation apparatus of the present invention.

What is claimed is:
1. A laser irradiation apparatus comprising:
   a laser oscillator,
   an optical system to convert a laser light emitted from the laser oscillator so that a beam spot on a surface to be irradiated becomes a line shape or an elliptical shape; and
   a means for controlling a scanning speed of the converted laser light so as to become higher as the beam spot gets closer to a center of the surface to be irradiated and become lower as the beam spot gets farther from the center of the surface to be irradiated.

2. A laser irradiation apparatus according to claim 1, wherein the scanning speed of the laser light is determined based on an energy distribution obtained by a means for focusing the laser light.

3. A laser irradiation apparatus according to claim 1, wherein the scanning speed of the laser light is controlled to homogenize an irradiation energy on the surface to be irradiated.

4. A laser irradiation apparatus according to claim 1, wherein an irradiation position of the beam spot is controlled to scan a specific position on the surface to be irradiated.

5. A laser irradiation apparatus according to claim 1, wherein the laser oscillator is a continuous oscillation solid laser.

6. A laser irradiation apparatus according to claim 1, wherein the laser oscillator is at least one selected from the group consisting of a continuous oscillation YAG laser, $YVO_4$ laser, YLF laser, $YAlO_3$ laser, $Y_2O_3$ laser, Alexandrite laser, and Ti: Sapphire laser.

7. A laser irradiation apparatus according to claim 1, wherein the laser oscillator is one of a continuous oscillation Ar laser and Kr laser.

8. A laser irradiation apparatus according to claim 1, wherein the laser light is a harmonic wave.

9. A laser irradiation apparatus comprising:
a laser oscillator;
an optical system to convert a laser light emitted from the laser oscillator so that a beam spot on a surface to be irradiated becomes a line shape or an elliptical shape;
a means for scanning while keeping a shape of the converted laser light on the surface to be irradiated constant; and
a means for controlling a scanning speed of the scanning means so as to become higher as the beam spot gets closer to a center of the surface to be irradiated and become lower as the beam spot gets farther from the center of the surface to be irradiated.

10. A laser irradiation apparatus according to claim 9, wherein the shape of the laser light is kept constant by adjusting a focal point of the laser light on the surface to be irradiated.

11. A laser irradiation apparatus according to claim 9, wherein the scanning speed of the laser light is determined based on an energy distribution obtained by a means for focusing the laser light.

12. A laser irradiation apparatus according to claim 9, wherein the scanning speed of the laser light is controlled to homogenize an irradiation energy on the surface to be irradiated.

13. A laser irradiation apparatus according to claim 9, wherein an irradiation position of the beam spot is controlled to scan a specific position on the surface to be irradiated.

14. A laser irradiation apparatus according to claim 9, wherein the laser oscillator is a continuous oscillation solid laser.

15. A laser irradiation apparatus according to claim 9, wherein the laser oscillator is at least one selected from the group consisting of a continuous oscillation YAG laser, $YVO_4$ laser, YLF laser, $YAlO_3$ laser, $Y_2O_3$ laser, Alexandrite laser, and Ti: Sapphire laser.

16. A laser irradiation apparatus according to claim 9, wherein the laser oscillator is one of a continuous oscillation Ar laser and Kr laser.

17. A laser irradiation apparatus according to claim 9, wherein the laser light is a harmonic wave.

18. A laser irradiation apparatus comprising:
a laser oscillator;
an optical system to convert a laser light emitted from the laser oscillator so that a beam spot on a surface to be irradiated becomes a line shape or an elliptical shape;
a means for deflecting the converted laser light and scanning while keeping a shape of the deflected laser light on the surface to be irradiated constant; and
a means for controlling a scanning speed of the converted laser light so as to become higher as the beam spot gets closer to a center of the surface to be irradiated and become lower as the beam spot gets farther from the center of the surface to be irradiated.

19. A laser irradiation apparatus according to claim 18, wherein the means for deflecting the converted laser light and scanning while keeping the shape of the deflected laser light on the surface to be irradiated constant has at least one of a galvanometer mirror, a polygon mirror, an fθ lens and a telecentric fθ lens.

20. A laser irradiation apparatus according to claim 18, wherein the shape of the laser light is kept constant by adjusting a focal point of the laser light on the surface to be irradiated.

21. A laser irradiation apparatus according to claim 18, wherein the scanning speed of the laser light is determined based on an energy distribution obtained by a means for focusing the laser light.

22. A laser irradiation apparatus according to claim 18, wherein the scanning speed of the laser light is controlled to homogenize an irradiation energy on the surface to be irradiated.

23. A laser irradiation apparatus according to claim 18, wherein an irradiation position of the beam spot is controlled to scan a specific position on the surface to be irradiated.

24. A laser irradiation apparatus according to claim 18, wherein the laser oscillator is a continuous oscillation solid laser.

25. A laser irradiation apparatus according to claim 18, wherein the laser oscillator is at least one selected from the group consisting of a continuous oscillation YAG laser, $YVO_4$ laser, YLF laser, $YAlO_3$ laser, $Y_2O_3$ laser, Alexandrite laser, and Ti: Sapphire laser.

26. A laser irradiation apparatus according to claim 18, wherein the laser oscillator is one of a continuous oscillation Ar laser and Kr laser.

27. A laser irradiation apparatus according to claim 18, wherein the laser light is a harmonic wave.

* * * * *